US010312748B2

(12) United States Patent
Tsai et al.

(10) Patent No.: US 10,312,748 B2
(45) Date of Patent: Jun. 4, 2019

(54) SIGNAL ANALYSIS METHOD AND CIRCUIT

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Techology Co., Ltd., New Taipei (TW)

( * ) Notice: Subject to any disclaimer, the term of this patent is extended or adjusted under 35 U.S.C. 154(b) by 213 days.

(21) Appl. No.: 15/197,796

(22) Filed: Jun. 30, 2016

(65) Prior Publication Data

US 2016/0308404 A1    Oct. 20, 2016

Related U.S. Application Data

(63) Continuation-in-part of application No. 14/876,788, filed on Oct. 6, 2015, now Pat. No. 9,831,687, and a
(Continued)

(30) Foreign Application Priority Data

Feb. 1, 2011   (TW) .............................. 100103836 A
May 3, 2013    (TW) .............................. 102115983 A
(Continued)

(51) Int. Cl.
*G01R 19/17*   (2006.01)
*H02J 50/12*   (2016.01)
(Continued)

(52) U.S. Cl.
CPC .............. *H02J 50/80* (2016.02); *G01R 31/42* (2013.01); *H02J 7/025* (2013.01); *H02J 50/12* (2016.02);
(Continued)

(58) Field of Classification Search
USPC ........................................................ 307/104
See application file for complete search history.

(56) References Cited

U.S. PATENT DOCUMENTS 3,573,817 A    4/1971   Akers
4,393,516 A    7/1983   Itani
(Continued)

FOREIGN PATENT DOCUMENTS

CN    1142649 A    2/1997
CN    1476535 A    2/2004
(Continued)

OTHER PUBLICATIONS

Yang, "A Multi-Coil Wireless Charging System with Parasitic Mental Detection", Donghua University Master Dissertation, China Master's Theses Full-text Database, Engineering Technology II, vol. 9, May 2014.

*Primary Examiner* — Rexford N Barnie
*Assistant Examiner* — Xuan Ly
(74) *Attorney, Agent, or Firm* — Winston Hsu

(57) ABSTRACT

A signal analysis method for determining whether a supplying-end module of an induction type power supply system receives a modulation signal from a receiving-end module of the induction type power supply system includes obtaining a coil signal on a supplying-end coil of the supplying-end module; retrieving parts of the coil signal higher than a reference voltage to generate a peak signal; tracking the peak signal to obtain a peak voltage level; configuring a high voltage level higher than the peak voltage level and a low voltage level lower than the peak voltage level; and determining whether a plurality of peak values of the peak signal reach the high voltage level and determining whether the plurality of peak values of the peak signal reach the low voltage level during a determination cycle, and determining
(Continued)

whether the supplying-end module receives the modulation signal accordingly.

22 Claims, 3 Drawing Sheets

Related U.S. Application Data continuation-in-part of application No. 14/822,875, filed on Aug. 10, 2015, now Pat. No. 9,960,639, and a continuation-in-part of application No. 14/731,421, filed on Jun. 5, 2015, now Pat. No. 10,038,338, application No. 14/876,788, which is a continuation-in-part of application No. 14/017,321, filed on Sep. 4, 2013, now Pat. No. 9,628,147, application No. 14/731,421, which is a continuation-in-part of application No. 14/017,321, filed on Sep. 4, 2013, now Pat. No. 9,628,147, which is a continuation-in-part of application No. 13/541,090, filed on Jul. 3, 2012, now Pat. No. 9,075,587, application No. 14/731,421, which is a continuation-in-part of application No. 13/541,090, filed on Jul. 3, 2012, now Pat. No. 9,075,587, application No. 14/017,321, which is a continuation-in-part of application No. 13/212,564, filed on Aug. 18, 2011, now Pat. No. 8,941,267, which is a continuation-in-part of application No. 13/154,965, filed on Jun. 7, 2011, now Pat. No. 8,810,072.

(30) Foreign Application Priority Data

| Jan. 14, 2015 | (TW) | ............................. 104101227 A |
| Jun. 2, 2015 | (TW) | ............................. 104117722 A |
| Jun. 30, 2015 | (TW) | ............................. 104121025 A |
| Apr. 14, 2016 | (TW) | ............................. 105111620 A |

(51) Int. Cl.

| *H02J 50/80* | (2016.01) |
| *H02J 50/90* | (2016.01) |
| *H02M 3/337* | (2006.01) |
| *H02J 7/02* | (2016.01) |
| *G01R 31/42* | (2006.01) |
| *G01R 19/04* | (2006.01) |

(52) U.S. Cl.
CPC ............. *H02J 50/90* (2016.02); *H02M 3/337* (2013.01); *G01R 19/04* (2013.01); *G01R 19/17* (2013.01); *Y02B 70/1433* (2013.01)

(56) References Cited

U.S. PATENT DOCUMENTS

| 5,270,998 | A | 12/1993 | Uchiumi |
| 7,720,452 | B2 | 5/2010 | Miyahara |
| 7,939,963 | B2 | 5/2011 | Chang |
| 8,072,310 | B1 | 12/2011 | Everhart |
| 8,422,420 | B1 | 4/2013 | Gulasekaran |
| 8,731,116 | B2 * | 5/2014 | Norconk ............. H04B 5/0031 |
| | | | 340/10.1 |
| 9,048,881 | B2 | 6/2015 | Tsai |
| 9,075,587 | B2 | 7/2015 | Tsai |
| 9,553,485 | B2 | 1/2017 | Singh |
| 9,995,777 | B2 | 6/2018 | Von Novak, III |
| 10,122,220 | B2 | 11/2018 | Sankar |
| 2003/0123168 | A1 | 7/2003 | Yokomizo |
| 2005/0076102 | A1 | 4/2005 | Chen |
| 2008/0030398 | A1 | 2/2008 | Nakamura |
| 2009/0026844 | A1 * | 1/2009 | Iisaka ..................... H02J 7/025 |
| | | | 307/104 |
| 2009/0271048 | A1 | 10/2009 | Wakamatsu |
| 2009/0284082 | A1 | 11/2009 | Mohammadian |
| 2009/0302800 | A1 | 12/2009 | Shiozaki |
| 2010/0098177 | A1 | 4/2010 | Hamaguchi |
| 2010/0225173 | A1 | 9/2010 | Aoyama |
| 2010/0237943 | A1 | 9/2010 | Kim |
| 2010/0270867 | A1 | 10/2010 | Abe |
| 2011/0196544 | A1 | 8/2011 | Baarman |
| 2011/0241436 | A1 | 10/2011 | Furukawa |
| 2012/0153739 | A1 | 6/2012 | Cooper |
| 2012/0293009 | A1 | 11/2012 | Kim |
| 2013/0049484 | A1 | 2/2013 | Weissentern |
| 2013/0162054 | A1 | 6/2013 | Komiyama |
| 2013/0162204 | A1 | 6/2013 | Jung |
| 2013/0175873 | A1 | 7/2013 | Kwon |
| 2013/0175937 | A1 | 7/2013 | Nakajo |
| 2013/0176023 | A1 | 7/2013 | Komiyama |
| 2013/0267213 | A1 | 10/2013 | Hsu |
| 2013/0342027 | A1 | 12/2013 | Tsai |
| 2014/0024919 | A1 | 1/2014 | Metzenthen |
| 2014/0077616 | A1 | 3/2014 | Baarman |
| 2014/0084857 | A1 | 3/2014 | Liu |
| 2014/0184152 | A1 | 7/2014 | Van Der Lee |
| 2014/0355314 | A1 | 12/2014 | Ryan |
| 2015/0028875 | A1 | 1/2015 | Irie |
| 2015/0044966 | A1 | 2/2015 | Shultz |
| 2015/0054355 | A1 | 2/2015 | Ben-Shalom |
| 2015/0123602 | A1 | 5/2015 | Patino |
| 2015/0162054 | A1 | 6/2015 | Ishizu |
| 2015/0162785 | A1 | 6/2015 | Lee |
| 2015/0263531 | A1 | 9/2015 | Kozakai |
| 2015/0285926 | A1 | 10/2015 | Oettinger |
| 2015/0372493 | A1 | 12/2015 | Sankar |
| 2016/0064951 | A1 | 3/2016 | Yamamoto |
| 2016/0064952 | A1 | 3/2016 | Matsumoto |
| 2016/0072336 | A1 | 3/2016 | Tamino |
| 2016/0241086 | A1 | 8/2016 | Jung |
| 2016/0349782 | A1 | 12/2016 | Tsai |
| 2018/0138756 | A1 | 5/2018 | Bae |

FOREIGN PATENT DOCUMENTS

| CN | 1930790 A | 3/2007 |
| CN | 101106388 A | 1/2008 |
| CN | 101907730 A | 12/2010 |
| CN | 101924399 A | 12/2010 |
| CN | 101978571 A | 2/2011 |
| CN | 102054057 A | 5/2011 |
| CN | 102055250 A | 5/2011 |
| CN | 102157991 A | 8/2011 |
| CN | 102474133 A | 5/2012 |
| CN | 202404630 U | 8/2012 |
| CN | 102804619 A | 11/2012 |
| CN | 103069689 A | 4/2013 |
| CN | 103248130 A | 8/2013 |
| CN | 103457361 A | 12/2013 |
| CN | 103852665 A | 6/2014 |
| CN | 103975497 A | 8/2014 |
| CN | 104160300 A | 11/2014 |
| CN | 204190475 U | 3/2015 |
| CN | 104521151 A | 4/2015 |
| CN | 104685760 A | 6/2015 |
| CN | 104734370 A | 6/2015 |
| CN | 105049008 A | 11/2015 |
| CN | 105449875 A | 3/2016 |
| CN | 205105005 U | 3/2016 |
| CN | 106134037 A | 11/2016 |
| CN | 106571692 A | 4/2017 |
| EP | 2 793 355 A1 | 10/2014 |
| EP | 3 160 008 A1 | 4/2017 |
| JP | 2008206305 A | 9/2008 |
| JP | 2010213414 A | 9/2010 |
| JP | 2013135518 A | 7/2013 |
| JP | 2014171371 A | 9/2014 |
| JP | 6122402 | 4/2017 |
| JP | 2017511117 A | 4/2017 |
| KR | 100650628 B1 | 11/2006 |

(56) References Cited

FOREIGN PATENT DOCUMENTS

| | | |
|---|---|---|
| TW | 201034334 A1 | 9/2010 |
| TW | 201440368 A | 10/2014 |
| TW | I459676 B | 11/2014 |
| TW | I483509 B | 5/2015 |
| TW | 201605143 A | 2/2016 |
| TW | I577108 B | 4/2017 |
| TW | I596546 B | 8/2017 |
| TW | I604678 B | 11/2017 |
| WO | 2013043974 A2 | 3/2013 |
| WO | 2015154086 A1 | 10/2015 |
| WO | 2016/159788 A1 | 10/2016 |

* cited by examiner

SIGNAL ANALYSIS METHOD AND CIRCUIT

CROSS REFERENCE TO RELATED APPLICATIONS

This application is a continuation-in-part application of U.S. application Ser. No. 14/822,875, filed on Aug. 10, 2015, a continuation-in-part application of U.S. application Ser. No. 14/731,421, filed on Jun. 5, 2015, and a continuation-in-part application of U.S. application Ser. No. 14/876,788, filed on Oct. 6, 2015, the contents of which are incorporated herein by reference.

U.S. application Ser. No. 14/731,421 is further a continuation-in-part application of U.S. application Ser. No. 14/017,321, filed on Sep. 4, 2013, and a continuation-in-part application of U.S. application Ser. No. 13/541,090, filed on Jul. 3, 2012. U.S. application Ser. No. 14/017,321 is further a continuation-in-part application of U.S. application Ser. No. 13/541,090, filed on Jul. 3, 2012, and a continuation-in-part application of U.S. application Ser. No. 13/212,564, filed on Aug. 18, 2011, which is further a continuation-in-part application of U.S. application Ser. No. 13/154,965, filed on Jun. 7, 2011. U.S. application Ser. No. 14/876,788 is further a continuation-in-part application of U.S. application Ser. No. 14/017,321, filed on Sep. 4, 2013.

BACKGROUND OF THE INVENTION

1. Field of the Invention

The present invention relates to a signal analysis method and circuit, and more particularly, to a signal analysis method and circuit used in an induction type power supply system.

2. Description of the Prior Art

In an induction type power supply system, each of the power supplying terminal and the power receiving terminal includes a coil for performing induction. When the coils are operated, the relative distance between the two coils is usually smaller than the diameter of the coils. With the small distance between these two coils, the electrical characteristics of the coils may be mutually influenced during the induction process. In the induction type power supply system, sending of power is controlled by the power supplying terminal, and the power output status is monitored by the power receiving terminal, wherein the power receiving terminal needs to transmit data to the power supplying terminal to communicate with the power supplying terminal. Since there is no physical connection media between the power supplying terminal and the power receiving terminal, the communication should be performed via wireless communication technology. A common communication method applied in the industry is that the power receiving terminal varies the electrical characteristics of the receiving-end coil using signal modulation technology, where the variations of the electrical characteristics are reflected to the power supplying terminal to generate signal variations on the supplying-end coil. The power supplying terminal then recovers the modulation signals of the power receiving terminal via demodulation technology, and then decodes a combination of modulation signals to obtain a data code.

However, there are still several problems which cannot be effectively solved by the above method. First of all, the power receiving terminal generates the modulation signals and transmits the modulation signals to the power supplying terminal, and the power supplying terminal then performs demodulation on the received signals. The modulation and demodulation scheme is similar to the amplitude modulation (AM) of the wireless communication technology, where a circuit element such as an envelope detector or a low-pass filter is used to filter out the high frequency component of the signal, in order to form a low frequency signal. This implementation is feasible if two conditions are met. The first one is that the carrier frequency should be far higher than the frequency of modulation signal, and the second one is that the carrier should be relatively stable and the modulation degree should be large enough. The operating frequency in an induction type power supply system is substantially equal to 125 kHz due to the characteristics of the switching elements and the regulations of electromagnetic interference limitation. In such a situation, in order to clearly separate the modulation signal and the carrier signal, the frequency ratio of these two signals should be up to 100 or more. Since the carrier signal is a low frequency signal, the data frequency that can be transmitted by the carrier should be much lower. This limits the speed of data transmission.

In addition, several power supplying terminals are configured to control the amplitude variations of the resonant voltage by varying the driving frequency of the coil, in order to vary the magnitude of output power. Therefore, the carrier frequency of the signals on the supplying-end coil may not be fixed, such that the power receiving terminal is required to perform modulation in different carrier frequencies. However, in the power supplying terminal, the envelope detector used for detecting the modulation signal may not be corresponding to different frequencies, and therefore cannot accurately retrieve the modulation signal. In addition, during operations of the induction type power supply system, the value of the resonant voltage may change with the magnitude of output power. For example, when the power supplying terminal outputs low power, e.g., 1 Watt, a resonant voltage of 20 Volts may be enough. When the output power of the power supplying terminal increases to 100 Watts, the resonant voltage may reach 200 Volts or more. However, a general envelope detector cannot remain satisfactory capability throughout the high range of resonant voltage. In other words, since the envelope detector and filter circuit have a poor dynamic range, the envelope detecting capability in the prior art has a formidable difficulty.

As mentioned above, two conditions should be met to clearly analyze the signals by the conventional signal modulation method used for the induction type power supply system. The first condition is that the modulation degree should be large enough, and the second is that the modulation frequency should be far lower than the carrier frequency. The above carrier is provided by the power supplying terminal, and the modulation degree is determined by the modulation strength of the power receiving terminal, where the modulation strength refers to the strength applied on the receiving-end coil to vary the electrical characteristics of the coil. In general, the signal modulation is to vary the resonant point by varying the impedance or electrical characteristics of the coil or adding a capacitor connected to the receiving coil in parallel, allowing the signal to reflect to the supplying-end coil to vary its signal amplitude. However, the higher modulation degree may affect the power output capability in the back-end more easily since the modulation process may generate a load on the coil. In addition, when the system is operated in a higher power, the power outputted to the back-end load from the receiving-end coil may reach an upper limit. At this moment, it is hard to insert a variation on the electrical characteristics of the receiving-end coil via modulation operations. That is, neither increasing nor decreasing the load on the coil can generate an enough modulation degree. For example, the load varying capability of the modulation circuit may be 1 Watt. When the power receiving terminal outputs power equal to 5 Watts, the variation ratio generated via coil modulation may achieve 1/5, which can be reflected to the supplying-end coil and the modulation degree is still enough. When the power receiving terminal outputs power equal to 100 Watts, the variation ratio generated via coil modulation is only 1/100. Therefore, the modulation method cannot be operated with high output power. In fact, the load varying capability of the modulation circuit possesses an upper limit since increasing of load may burn the circuit and decreasing of load may reduce the power output efficiency in the back end.

On the other hand, the modulation signal belongs to digital data. In the prior art, the modulation should be continuously performed for a specific period of time, where the frequency of the modulation signal should be at least 100-fold lower than the frequency of the carrier, in order to be separated by the filter of the power supplying terminal. In other words, the length of the modulation signal should be longer than or equal to 100 resonant cycles. However, power loss may occur during the modulation process, and the lower modulation frequency decreases the data transmission speed, which reduces the performance of the induction type power supply system. In brief, the modulation strength should be increased in order to increase the modulation degree, and the modulation frequency should be decreased in order to allow the filter to clearly separate the carrier and the modulation signal. The modulation technology in the prior art may not meet these two conditions, and therefore the application of the legacy modulation technology has a formidable difficulty.

Thus, there is a need to provide a new signal analysis method and circuit to obtain a more preferable signal analysis performance and also prevent the above problems.

SUMMARY OF THE INVENTION

It is therefore an objective of the present invention to provide a signal analysis method and circuit capable of analyzing modulation signals in a supplying-end module of an induction type power supply system.

The present invention discloses a signal analysis method used in a supplying-end module of an induction type power supply system. The signal analysis method is used for determining whether the supplying-end module receives a modulation signal from a receiving-end module of the induction type power supply system. The signal analysis method comprises obtaining a coil signal on a supplying-end coil of the supplying-end module; retrieving parts of the coil signal higher than a reference voltage to generate a peak signal; tracking the peak signal to obtain a peak voltage level; configuring a high voltage level higher than the peak voltage level and a low voltage level lower than the peak voltage level; and determining whether a plurality of peak values of the peak signal reach the high voltage level and determining whether the plurality of peak values of the peak signal reach the low voltage level during a determination cycle, and determining whether the supplying-end module receives the modulation signal accordingly.

The present invention further discloses a signal analysis circuit used in a supplying-end module of an induction type power supply system. The signal analysis circuit is used for determining whether the supplying-end module receives a modulation signal from a receiving-end module of the induction type power supply system. The signal analysis circuit comprises a voltage measurement circuit, an operational amplifier, a first comparator module, a processor, a second comparator module and a third comparator module. The voltage measurement circuit is used for obtaining a coil signal on a supplying-end coil of the supplying-end module. The operational amplifier is used for retrieving parts of the coil signal higher than a reference voltage to generate a peak signal. The first comparator module, coupled to the operational amplifier, is used for tracking the peak signal to obtain a peak voltage level. The processor, coupled to the first comparator module, is used for receiving the peak voltage level and configuring a high voltage level higher than the peak voltage level and a low voltage level lower than the peak voltage level. The second comparator module, coupled to the processor and the operational amplifier, is used for comparing the peak signal with the high voltage level to determine whether a plurality of peak values of the peak signal reach the high voltage level during a determination cycle, to obtain a first comparison result. The third comparator module, coupled to the processor and the operational amplifier, is used for comparing the peak signal with the low voltage level to determine whether the plurality of peak values of the peak signal reach the low voltage level during the determination cycle, to obtain a second comparison result. The processor determines whether the supplying-end module receives the modulation signal according to the first comparison result of the second comparator module and the second comparison result of the third comparator module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
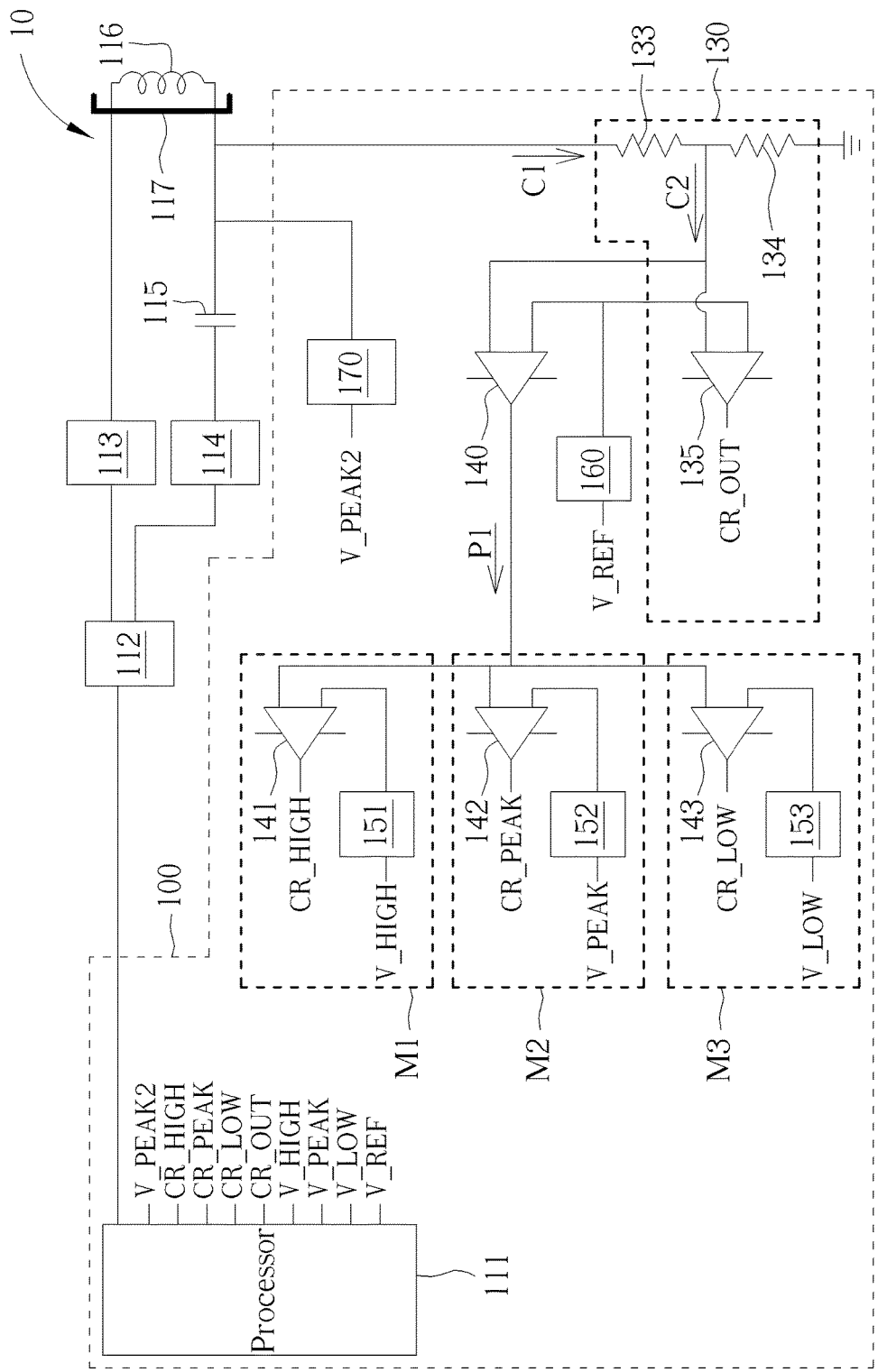
FIG. 1 is a schematic diagram of a supplying-end module according to an embodiment of the present invention.

Please refer to FIG. 1, which is a schematic diagram of a supplying-end module 10 according to an embodiment of the present invention. As shown in FIG. 1, the supplying-end module 10, which may be used for an induction type power supply system, includes a signal analysis circuit 100, a clock generator 112, power driver units 113 and 114, a resonant capacitor 115, a supplying-end coil 116 and a magnetic conductor 117. The supplying-end coil 116 is used for delivering electromagnetic energies to the receiving-end module of the induction type power supply system to supply power. The resonant capacitor 115, coupled to the supplying-end coil 116, is used for performing resonance together with the supplying-end coil 116. In addition, in the supplying-end module 10, a magnetic conductor 117 composed of magnetic materials may be selectively disposed, to enhance the electromagnetic induction capability of the supplying-end coil 116 and also prevent electromagnetic energies from affecting the objects located in the non-inducting side of the coil. The power driver units 113 and 114, coupled to the supplying-end coil 116 and the resonant capacitor 115, are used for sending driving signals to the supplying-end coil 116. The power driver units 113 and 114 may be controlled by the clock generator 112, for driving the supplying-end coil 116 to generate and send power. When the power driver units 113 and 114 are both active, full-bridge driving is performed. In another embodiment, only one of the power driver units 113 and 114 is active, or only one of the power driver units 113 and 114 is disposed, which leads to half-bridge driving. Other possible components or modules such as a power supply unit and display unit may be included or not according to system requirements. These components are omitted without affecting the illustrations of the present embodiments.

Please keep referring to FIG. 1. The signal analysis circuit 100 includes a processor 111, a voltage measurement circuit 130, an operational amplifier 140, comparator modules M1-M3, a digital to analog converter (DAC) 160 and a sampling module 170. In this embodiment, the processor 111 is included in the signal analysis circuit 100, but in another embodiment, the processor 111 may be disposed in the supplying-end module 10 alone, and is not limited herein. The processor 111 is used for performing signal analysis and interpretation, to determine whether the supplying-end module 10 receives the modulation signal from a receiving-end module of the induction type power supply system. The processor 111 may also be used for controlling the clock generator 112, in order to control the power driver units 113 and 114 to drive the supplying-end coil 116 to supply power. The processor 111 may be a central processing unit (CPU), a microprocessor, a micro controller unit (MCU) or any other type of processing device.

The voltage measurement circuit 130, which includes voltage dividing resistors 133 and 134 and a comparator 135, is used for obtaining a coil signal C1 on the supplying-end coil 116. Since the coil signal C1 may always have a larger voltage, the voltage dividing resistors 133 and 134 may attenuate the coil signal C1 and then generate a voltage dividing signal C2, which is further outputted to the back-end circuit for follow-up processing. In some embodiments, if the tolerance voltage of the circuit elements in the signal analysis circuit 100 is high enough, the voltage dividing resistors 133 and 134 may not be applied and the coil signal C1 may be directly received from the supplying-end coil 116. The operations of the comparator 135 in the voltage measurement circuit 130 are illustrated in U.S. Publication No. 2015/0349546 A1 (see the comparator 112 shown in FIG. 1 and related descriptions). The difference between U.S. Publication No. 2015/0349546 A1 and the present invention is that the present invention applies a reference voltage $V_{13}$ REF configured by the processor 111 and the DAC 160 is used to output the analog voltage value of the reference voltage $V_{13}$ REF, while U.S. Publication No. 2015/0349546 A1 provides a constant voltage via a capacitor as the reference voltage. Since the characteristics of the capacitor may possess a larger mismatch, different devices may have different voltage levels, such that the amplification degree of signals may not be uniform. In an embodiment of the present invention, the reference voltage $V_{13}$ REF generated by using digital circuits may possess an accurate value; that is, the amplified parts of the coil signal C1 may be uniform via calculation of software. In short, the comparator 135 may output a comparison result CR_OUT to the processor 111. The processor 111 may accordingly configure the appropriate reference voltage $V_{13}$ REF as a basis for the operational amplifier 140 to perform amplification. The voltage measurement circuit 130 aims at obtaining the coil signal C1 and determining the peak locations, so that the back-end circuit may retrieve the peak voltage(s) from the coil signal C1. The operational amplifier 140 is used for retrieving parts of the voltage dividing signal C2 higher than a reference voltage (i.e., the peak parts of the coil signal C1) to generate a peak signal P1, where the reference voltage also comes from the DAC 160, i.e., the reference voltage $V_{13}$ REF. In other words, the operational amplifier 140 may amplify the peak parts of the coil signal C1, so that the comparator modules M1-M3 in the back end may perform comparison on the amplified peak signal P1, in order to obtain a more accurate determination result. In addition, when a significant variation occurs on the coil signal C1 (e.g., due to load variations in the power receiving terminal), the processor 111 may control the reference voltage $V_{13}$ REF to be adjusted with the variations of the coil signal C1, so that the operational amplifier 140 is able to perform amplification on the peak parts of the coil signal C1.

Subsequently, the comparator modules M1-M3 coupled to the operational amplifier 140 may receive the peak signal P1 and perform determination based on the peak signal P1. Since the peak signal P1 is amplified by the operational amplifier 140 in advance, the determination of the comparator modules M1-M3 may have high sensitivity. The comparator module M2 is used for tracking the peak signal P1 to obtain a peak voltage level V_PEAK. In detail, the comparator module M2 includes a comparator 142 and a DAC 152. The DAC 152 may receive the value of the peak voltage level V_PEAK obtained in the previous coil driving cycle from the processor 111, and convert the obtained value into an analog voltage. The comparator 142 then compares the analog voltage of the peak voltage level V_PEAK with the peak signal P1, to output a comparison result CR_PEAK. Subsequently, the processor 111 may determine whether the peak value of the peak signal P1 reaches the peak voltage level V_PEAK according to the comparison result CR_PEAK. The processor 111 may increase the value of the peak voltage level V_PEAK when the peak value reaches the peak voltage level V_PEAK, or decrease the value of the peak voltage level V_PEAK when the peak value fails to reach the peak voltage level V_PEAK. For example, the peak signal P1 includes a peak in each coil driving cycle. The comparison result CR_PEAK may be equal to 1, which means that the peak height of the peak signal P1 reaches the peak voltage level V_PEAK. In such a situation, the processor 111 may control the value of the peak voltage level V_PEAK to increase by one step, e.g., add 1 to the digital value of the peak voltage level V_PEAK. The updated value of the peak voltage level V_PEAK is then fed back to the input terminal of the comparator module M2 for the determination in the next coil driving cycle. Subsequently, in the next coil driving cycle, the comparison result CR_PEAK may be equal to 0, which means that the peak height of the peak signal P1 fails to reach the peak voltage level V_PEAK. In such a situation, the processor 111 may control the value of the peak voltage level V_PEAK to decrease by one step, e.g., subtract 1 from the digital value of the peak voltage level V_PEAK. The updated value of the peak voltage level V_PEAK is then fed back to the input terminal of the comparator module M2 for the determination in the following coil driving cycle. In this manner, the peak voltage level V_PEAK is able to keep tracking the peak height of the peak signal P1. In each coil driving cycle, the adjustment degree of the peak voltage level V_PEAK may be configured in advance, or the processor 111 may determine the adjustment degree according to the status of the coil signal C1, in consideration of both the stability of the peak voltage level V_PEAK and the speed of tracking the peak signal P1.

Subsequently, the processor 111 may configure a high voltage level V_HIGH slightly higher than the peak voltage level V_PEAK and a low voltage level V_LOW slightly lower than the peak voltage level V_PEAK according to the magnitude of the peak voltage level V_PEAK. In each coil driving cycle, the processor 111 may obtain a new value of the peak voltage level V_PEAK according to the determination result of the comparator module M2 in the previous cycle. According to a distance R in a current configuration, the processor 111 may also generate the high voltage level V_HIGH higher than the peak voltage level V_PEAK with a distance R from the peak voltage level V_PEAK, and generate the low voltage level V_LOW lower than the peak voltage level V_PEAK with a distance R from the peak voltage level V_PEAK. The comparator module M1 includes a comparator 141 and a DAC 151, and the comparator module M3 includes a comparator 143 and a DAC 153. In the comparator module M1, the DAC 151 may receive the high voltage level V_HIGH from the processor 111 and convert the value of the high voltage level V_HIGH into an analog voltage. The comparator 141 then compares the analog voltage of the high voltage level V_HIGH with the peak signal P1. Since the peak voltage level V_PEAK is used for tracking the peak value of the peak signal P1 and the high voltage level V_HIGH is higher than the peak voltage level V_PEAK with a specific distance R, the peaks of the peak signal P1 should be always lower than the high voltage level V_HIGH when the coil signal C1 is stable. At this moment, the comparison result $CR_{13}$ HIGH outputted by the comparator 141 may remain in the low voltage level, which means that there is no trigger. In the comparator module M3, the DAC 153 may receive the low voltage level V_LOW from the processor 111 and convert the value of the low voltage level V_LOW into an analog voltage. The comparator 143 then compares the analog voltage of the low voltage level V_LOW with the peak signal P1. Since the peak voltage level V_PEAK is used for tracking the peak value of the peak signal P1 and the low voltage level V_LOW is lower than the peak voltage level V_PEAK with a specific distance R, the peaks of the peak signal P1 should be always higher than the low voltage level V_LOW when the coil signal C1 is stable. At this moment, the comparison result CR_LOW outputted by the comparator 143 may continuously generate pulse signals on the peak locations, which means that the triggers continuously appear.

The sampling module 170 includes circuit elements such as an analog-to-digital converter (ADC), a storage capacitor, an operational amplifier, a converting switch and voltage dividing resistors (not illustrated). The detailed circuit structure and operations are illustrated in U.S. Publication No. 2015/0349546 A1 (see the sampling module 118 shown in FIG. 1 and related descriptions). The sampling module 170 is used for sampling the coil signal C1 on the peak locations to obtain the peak voltage V_PEAK2, and outputting the peak voltage V_PEAK2 to the processor 111. In addition, since the comparator module M2 may also be used for obtaining the peak voltage level V_PEAK, the processor 111 may compare the peak voltage V_PEAK2 sampled and obtained by the sampling module 170 with the peak voltage level V_PEAK of the comparator module M2, to determine whether the system is operated normally. For example, if the difference between the peak voltage V_PEAK2 sampled and obtained by the sampling module 170 and the peak voltage level V_PEAK of the comparator module M2 is quite large, there may be an error in the system or a circuit element may malfunction. The processor 111 may send an emergency signal or perform error correction accordingly.

When the signal analysis circuit 100 is active, the sampling module 170 and the voltage measurement circuit 130 may cooperate to obtain the value of the peak voltage. Subsequently, the processor 111 may subtract a specific value from the value of the peak voltage to generate the reference voltage $V_{13}$ REF to be outputted to the DAC 160. Therefore, the operational amplifier 140 may retrieve the peak parts of the coil signal C1 to generate the peak signal P1 according to the level of the reference voltage $V_{13}$ REF. In addition, the processor 111 may obtain an approximate value of the peak voltage level V_PEAK and configure the high voltage level V_HIGH and the low voltage level V_LOW accordingly based on the sampling result of the sampling module 170, and also start to tract via the peak voltage level V_PEAK and analyze the modulation signal.

Figure 2:
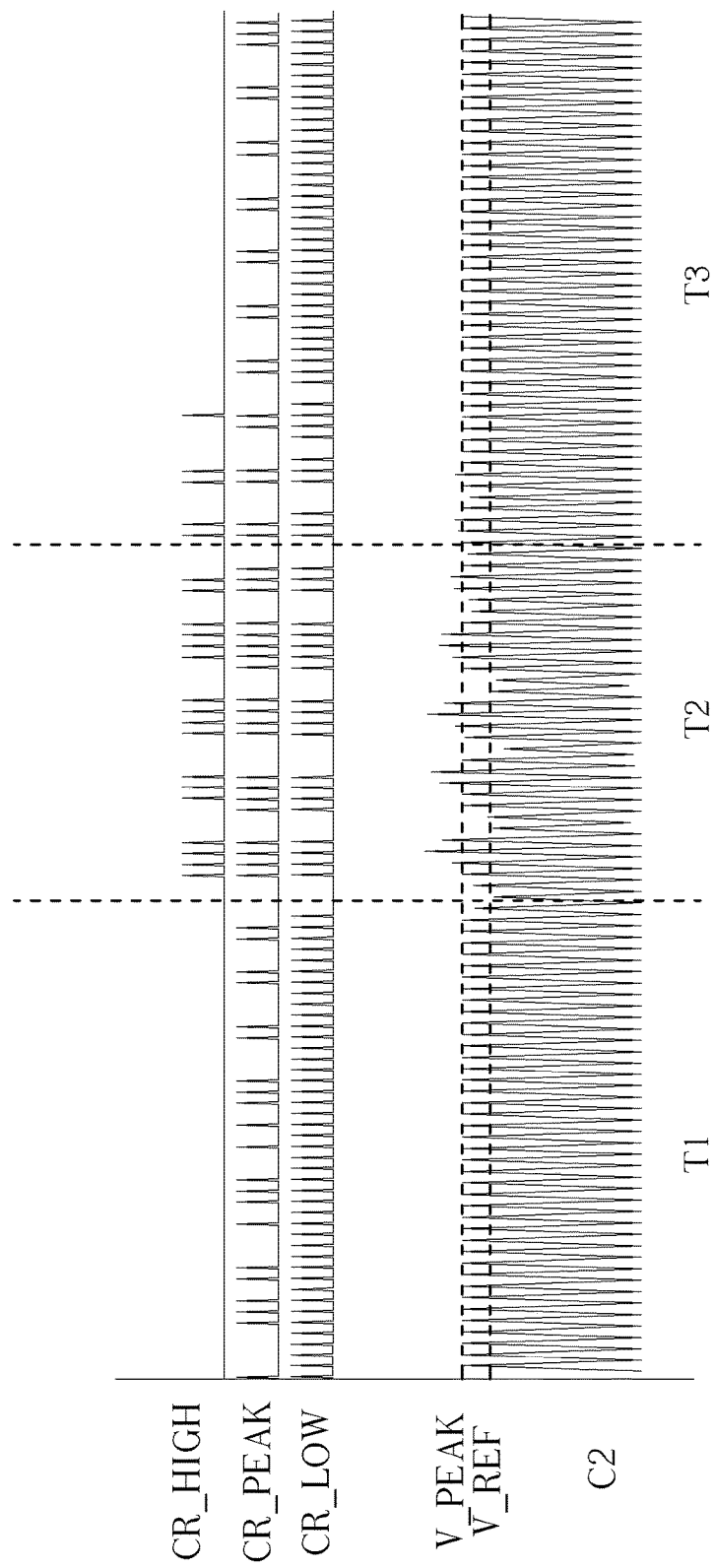
FIG. 2 is a waveform diagram of signals of the signal analysis circuit shown in FIG. 1.

Please refer to FIG. 2, which is a waveform diagram of signals of the signal analysis circuit 100. FIG. 2 illustrates the voltage dividing signal C2 generated after attenuation performed on the coil signal C1 shown in FIG. 1, and also illustrates the reference voltage V_REF, the peak voltage level V_PEAK and the comparison results $CR_{13}$ HIGH, CR_PEAK and CR_LOW of the comparator modules M1-M3, respectively. As shown in FIG. 2, parts of the coil signal C1 lower than 0 Volt may shrink when the coil signal C1 passes through the voltage dividing resistors 133 and 134; hence, the generated voltage dividing signal C2 cannot reflect the parts of the coil signal C1 lower than 0 Volt. However, according to the present invention, only the peak parts of the voltage dividing signal C2 are applied for the determination, while the waveforms lower than 0 Volt may not affect the determination result. In detail, the level of the reference voltage $V_{13}$ REF allows the peak parts of the voltage dividing signal C2 to be amplified by the operational amplifier 140, and the amplified parts are provided for the signal analysis circuit 100 to perform signal analysis. The peak voltage level V_PEAK may keep tracking the peak values of the signal, and is finely tuned according to the comparison result CR_PEAK of the comparator module M2. The tuning level may be quite small and is not evident in FIG. 2.

During the time period T1, the supplying-end module 10 does not receive any modulation signal, so the voltage dividing signal C2 remains at a stable level. In the comparator module M2, the peak voltage level V_PEAK keeps tracking peak locations of the signal; hence, several of the comparison results CR_PEAK indicate a trigger (i.e., a pulse signal appears) and several indicate no trigger (i.e., no pulse signal). The triggers may occur in several peak locations of the voltage dividing signal C2, which correspond to the peak locations of the coil signal C1. The high voltage level V_HIGH is slightly higher than the peak voltage level V_PEAK and apart from the peak voltage level V_PEAK with the distance R; hence, the comparison result $CR_{13}$ HIGH generated in each coil driving cycle indicates no trigger according to the determination result of the comparator module M1 that receives the high voltage level V_HIGH. On the other hand, the low voltage level V_LOW is slightly lower than the peak voltage level V_PEAK and apart from the peak voltage level V_PEAK with the distance R; hence, the comparison result CR_LOW generated in each coil driving cycle indicates a trigger according to the determination result of the comparator module M3 that receives the low voltage level V_LOW. As shown in FIG. 2, the comparison result CR_LOW has a pulse signal in each coil driving cycle in the time period T1, i.e., on each peak location of the coil signal C1.

Subsequently, in the time period T2, an up and down vibration appears on the voltage dividing signal C2, which means that the supplying-end module 10 receives a modulation signal from the receiving-end module. In general, the modulation scheme is to apply capacitors or resistors on both terminals of the receiving-end coil to vary the impedance characteristics of the coil, which is reflected to the power supplying terminal and then generates an up and down vibration signal on the supplying-end coil. The detailed operations related to signal modulation of the power receiving terminal are illustrated in U.S. Publication No. 2015/0270722 A1, and will not be narrated herein. When the supplying-end module 10 receives the modulation signal, an up and down vibration may appear on both of the coil signal C1 and the voltage dividing signal C2; hence, the peak signal P1 generated via amplification of the operational amplifier 140 may also have a waveform of up and down vibration. In such a condition, the comparison result $CR_{13}$ HIGH of the comparator module M1 may appear trigger signals and non-trigger signals intermittently, and the comparison result CR_LOW of the comparator module M3 may also appear trigger signals and non-trigger signals intermittently. That is, the comparison results in several coil driving cycles indicate a trigger and the comparison results in other coil driving cycles indicate no trigger.

Subsequently, in the time period T3, the modulation signal is completely received. At this moment, there is still a small vibration on the coil signal C1 and the voltage dividing signal C2, such that the comparison result $CR_{13}$ HIGH of the comparator module M1 has few trigger signals and the comparison result CR_LOW of the comparator module M3 has few non-trigger signals. The comparison result $CR_{13}$ HIGH and the comparison result CR_LOW then gradually recover to the status before reception of the modulation signal. In such a condition, every one of the comparison results $CR_{13}$ HIGH indicates no trigger and every one of the comparison results CR_LOW indicates a trigger.

As can be seen, when the modulation signal is received, the trigger behaviors of the comparison results $CR_{13}$ HIGH and CR_LOW may change, and the processor 111 may determine the reception of the modulation signal accordingly. In detail, the processor 111 may configure a determination cycle which has a specific timing length or a determination cycle may be configured in the system in advance. The number of trigger signals or non-trigger signals appearing in the comparison results $CR_{13}$ HIGH and CR_LOW may be determined in the determination cycle. This determination cycle may include any number of coil driving cycles; that is, the length of the determination cycle may correspond to a plurality of peak values in the coil signal C1, the voltage dividing signal C2 or the peak signal P1, wherein each peak value may correspond to one comparison result $CR_{13}$ HIGH and one comparison result CR_LOW. In general, according to the configurations in the power receiving terminal, one modulation signal may include four up and down vibrations on the coil signal, which may spread through several tens of coil driving cycles. Taking the illustration in FIG. 2 as an example, the length of the modulation signal appearing in the time period T2 is substantially equal to the timing length of 30 coil driving cycles. In such a condition, the determination cycle may be configured to be smaller than the timing length of the modulation signal, so that one determination cycle may be entirely included in the vibration pattern of the modulation signal, allowing the processor 111 to clearly determine the vibration behavior of the modulation signal in the determination cycle.

Furthermore, the comparator module M1 may determine whether the plurality of peak values reach the high voltage level V_HIGH in the determination cycle, and generate the comparison result $CR_{13}$ HIGH which indicates a trigger or no trigger accordingly. The comparator module M3 may determine whether the plurality of peak values reach the low voltage level V_LOW in the determination cycle, and generate the comparison result CR_LOW which indicates a trigger or no trigger accordingly. As a result, the processor 111 may determine whether the supplying-end module 10 receives the modulation signal according to the comparison results $CR_{13}$ HIGH and CR_LOW. In contrast to the prior art where the frequency ratio of the modulation signal and the carrier signal should be up to 100 or more such that a modulation signal should cover at least 100 coil driving cycles, in the embodiments of the present invention, the comparison results in a few or tens of coil driving cycles are enough for the analysis of modulation signal. This significantly increases the speed of data transmission.

In an embodiment, the processor 111 may determine whether the modulation signal is received according to the trigger number of times in a determination cycle. In detail, in each determination cycle, the processor 111 may determine a first number of times the plurality of peak values of the peak signal P1 reach the high voltage level V_HIGH and a second number of times the plurality of peak values of the peak signal P1 fail to reach the low voltage level V_LOW. A peak value that reaches a voltage level may generate a pulse in the output terminal of the comparator, which means that a trigger appears. A peak value that fails to reach a voltage level may not generate a pulse in the output terminal of the comparator, which means that no trigger appears. As mentioned above, in the time period T1 shown in FIG. 2, the comparison result $CR_{13}$ HIGH generated in every coil driving cycle indicates no trigger (i.e., the first number of times is 0) and the comparison result CR_LOW generated in every coil driving cycle indicates a trigger (i.e., the second number of times is 0) when the modulation signal does not appear. In the time period T2, several of the comparison results $CR_{13}$ HIGH of the comparator module M1 indicate a trigger and several indicate no trigger, several of the comparison results CR_LOW of the comparator module M3 indicate a trigger and several indicate no trigger; hence, neither of the first number of times nor the second number of times is 0. Based on the above trigger behavior, the processor 111 may determine whether a signal vibration appears according to the first number of times and the second number of times in the determination cycle. For example, the processor 111 may determine that the supplying-end module 10 receives the modulation signal when detecting that the sum of the first number of times and the second number of times is greater than or equal to a first threshold value and that the difference of the first number of times and the second number of times is smaller than or equal to a second threshold value. In detail, the sum of the first number of times and the second number of times greater than or equal to the first threshold value means that the coil signal C1 may have a larger vibration which exceeds the range between the high voltage level V_HIGH and the low voltage level V_LOW. The difference of the first number of times and the second number of times smaller than or equal to the second threshold value means that the coil signal C1 appears an up and down vibration rather than rising or falling in one way. The levels of the above first threshold value and second threshold value may be configured or adjusted by the processor 111 or configured in the system in advance.

In an embodiment, the determination cycle is configured to include 16 coil driving cycles, i.e., the processor 111 may keep performing the determination of modulation signals in every 16 coil driving cycles, in order to obtain 16 comparison results $CR_{13}$ HIGH, CR_PEAK and CR_LOW of the comparator modules M1-M3, respectively, in every 16 coil driving cycles. The processor 111 may configure the first threshold value to be equal to 8 and the second threshold value to be equal to 2. In other words, in continuous 16 coil driving cycles, the modulation signal is determined to be received when the sum of the first number of times and the second number of times is greater than or equal to 8 and the difference of the first number of times and the second number of times is smaller than or equal to 2.

In a determination cycle, the comparison results $CR_{13}$ HIGH, CR_PEAK and CR_LOW may appear as shown in Table 1, where the data number 1 stands for the latest data and the data number 16 stands for the earliest data. The symbol "y" stands for a trigger in the coil driving cycle, i.e., the peak value reaches a corresponding voltage level, and the symbol "n" stands for no trigger in the coil driving cycle, i.e., the peak value fails to reach a corresponding voltage level. In Table 1, all of the comparison results $CR_{13}$ HIGH are non-trigger signals, which means that the first number of times is equal to 0; and all of the comparison results CR_LOW are trigger signals, which means that the second number of times is equal to 0. Several of the comparison results CR_PEAK are trigger signals and several of the comparison results CR_PEAK are non-trigger signals, which means that the peak voltage level V_PEAK keeps tracking the peak locations of the signal by moving up and down. In this determination cycle, both of the first number of times and the second number of times are equal to 0, so the processor 111 determines that the supplying-end module 10 does not receive any modulation signal. In addition, the peak voltage level V_PEAK moves up and down to track the peak locations of the signal, which means that the coil signal C1 is stable (i.e., the status shown in the time period T1 of FIG. 2).

TABLE 1

|  | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| CR_HIGH | n | n | n | n | n | n | n | n | n | n | n | n | n | n | n | n |
| CR_PEAK | y | n | y | y | n | y | y | y | n | y | n | y | y | n | y | y |
| CR_LOW  | y | y | y | y | y | y | y | y | y | y | y | y | y | y | y | y |

In another determination cycle, the comparison results $CR_{13}$ HIGH, CR_PEAK and CR_LOW may appear as shown in Table 2. In Table 2, the comparison result $CR_{13}$ HIGH has 7 trigger signals, which means that the first number of times is equal to 7; and the comparison result CR_LOW has 5 non-trigger signals, which means that the second number of times is equal to 5. The sum of the first number of times and the second number of times is equal to 12, which is greater than the first threshold value 8. The difference of the first number of times and the second number of times is equal to 2, which does not exceed the second threshold value 2. Therefore, in this determination cycle, the processor 111 determines that the supplying-end module 10 receives the modulation signal, where the coil signal C1 has a waveform of an up and down vibration (i.e., the status shown in the time period T2 of FIG. 2).

TABLE 2

|  | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| CR_HIGH | y | y | y | n | n | n | n | n | y | y | y | n | n | n | n | y |
| CR_PEAK | y | y | y | n | n | n | n | y | y | y | y | y | n | n | n | y |
| CR_LOW  | y | y | y | y | n | n | n | y | y | y | y | y | n | n | y | y |

In a further determination cycle, the comparison results $CR_{13}$ HIGH, CR_PEAK and CR_LOW may appear as shown in Table 3. In Table 3, the comparison result $CR_{13}$ HIGH has 3 trigger signals, which means that the first number of times is equal to 3; and the comparison result CR_LOW has 2 non-trigger signals, which means that the second number of times is equal to 2. The sum of the first number of times and the second number of times is equal to 5, which does not reach the first threshold value 8. In such a situation, the processor 111 determines that the supplying-end module 10 does not receive the modulation signal. Please note that the waveform of the data numbers 1-8 appears to be similar to a modulation signal. Therefore, this determination cycle may cover an initial of a modulation signal, but the processor 111 cannot clearly identify whether the triggering feature is generated by an accurate modulation signal or a noise. If this signal is actually a modulation signal, the processor 111 may still obtain a determination result similar to that shown in Table 2 in the next determination cycle, and achieve an accurate determination.

TABLE 3

|  | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| CR_HIGH | n | n | n | y | y | y | n | n | n | n | n | n | n | n | n | n |
| CR_PEAK | n | n | y | y | y | y | y | n | n | y | n | y | y | y | n | y |
| CR_LOW  | n | y | y | y | y | y | y | y | n | y | y | y | y | y | y | y |

By the above determination method, the processor 111 may determine whether the supplying-end module 10 receives a modulation signal and is able to identify the difference between a modulation signal and a noise. A noise, which is a signal variation randomly appearing on the signal, may generate few scattered trigger signals in the comparison result $CR_{13}$ HIGH or few scattered non-trigger signals in the comparison result CR_LOW with comparison of the comparator modules M1-M3. Long-time noise interference may cause one of the first number of times and the second number of times to have a larger value. In contrast, the modulation signal is an up and down vibration on the coil signal C1. In such a condition, the first number of times and the second number of times may be close or equal to each other.

Please note that in an induction type power supply system, the transmission of modulation signal may be accompanied by power sending; hence, analysis of the modulation signal may easily be affected by power sending or loading status. In such a condition, the criteria for determining the modulation signal should be varied and adjusted in accordance with environmental situations, in order to increase the accuracy of signal analysis. In an embodiment, the processor 111 may dynamically adjust the distance between the peak voltage level V_PEAK and the high voltage level V_HIGH and the distance between the peak voltage level V_PEAK and the low voltage level V_LOW according to the stability of the coil signal C1. In an embodiment, the distance between the peak voltage level V_PEAK and the high voltage level V_HIGH and the distance between the peak voltage level V_PEAK and the low voltage level V_LOW are configured to be equal and adjusted synchronously.

More specifically, when the above distance is smaller, a trigger signal appears more easily in the comparison result $CR_{13}$ HIGH and a non-trigger signal appears more easily in the comparison result CR_LOW. In such a condition, the processor 111 may determine an occurrence of the modulation signal more easily. In other words, the smaller distance leads to a higher sensitivity for determination of the modulation signal. However, when the distance is smaller, the comparison results $CR_{13}$ HIGH and CR_LOW may more easily be affected by noises. Therefore, when the coil signal C1 is stable and the noises are smaller, the distance may be decreased, allowing weak modulation signal(s) to be determined easily. In contrast, when the coil signal C1 is unstable, the distance may be increased, to prevent a noise from being wrongly determined to be a modulation signal.

In an embodiment, the processor 111 includes a non-stability status counter for determining the stability of the coil signal C1. The value of the non-stability status counter is used for indicating the stability of the coil signal C1, where a larger value of the non-stability status counter indicates that the coil signal C1 is more unstable. The processor 111 may configure the non-stability status counter according to the comparison results $CR_{13}$ HIGH, CR_PEAK and CR_LOW. For example, the processor 111 may increase the value of the non-stability status counter when the difference of the first number of times and the second number of times during a determination cycle is greater than a specific value. In other words, if the difference of the first number of times that the comparison result $CR_{13}$ HIGH indicates a trigger and the second number of times that the comparison result CR_LOW indicates no trigger is large, the peak height of the coil signal C1 may be unstable or the distance of the voltage levels may be too small. At this moment, the value of the non-stability status counter may be increased by one step. On the other hand, the processor 111 may decrease the value of the non-stability status counter when both of the first number of times and the second number of times during a determination cycle are equal to zero. In other words, if every one of the comparison results $CR_{13}$ HIGH during the determination cycle indicates no trigger and every one of the comparison results CR_LOW indicates a trigger, the coil signal C1, which may have a smaller variation, is stable. At this moment, the value of the non-stability status counter may be decreased by one step. The value of the non-stability status counter is used for determining the distance between the peak voltage level V_PEAK and the high voltage level V_HIGH and the distance between the peak voltage level V_PEAK and the low voltage level V_LOW. For example, the processor 111 may increase the distance when the value of the non-stability status counter is greater than a specific threshold value, and decrease the distance when the value of the non-stability status counter is smaller than another threshold value. The value of the non-stability status counter may be adjusted according to the status of the coil signal C1, so that the processor 111 may adjust the distance between the peak voltage level V_PEAK and the high voltage level V_HIGH and the distance between the peak voltage level V_PEAK and the low voltage level V_LOW to an optimal value.

In a determination cycle, the comparison results $CR_{13}$ HIGH, CR_PEAK and CR_LOW may appear as shown in Table 4. In Table 4, the comparison result $CR_{13}$ HIGH has 10 trigger signals, which means that the first number of times is equal to 10; and the comparison result CR_LOW has no non-trigger signals, which means that the second number of times is equal to 0. The sum of the first number of times and the second number of times is equal to 10, which is greater than the first threshold value 8. The difference of the first number of times and the second number of times is equal to 10, which is greater than the second threshold value 2. Therefore, in this determination cycle, the processor 111 determines that the supplying-end module 10 does not receive the modulation signal. Please note that the trigger behavior in Table 4 may occur when the distance between the peak voltage level V_PEAK and the high voltage level V_HIGH is too small, such that noises may easily cause the comparison result $CR_{13}$ HIGH to generate a trigger. In such a condition, the processor 111 may increase the value of the non-stability status counter, in order to increase the distance between the peak voltage level V_PEAK and the high voltage level V_HIGH. In detail, the processor 111 may only increase the distance between the peak voltage level V_PEAK and the high voltage level V_HIGH, or increase the distance between the peak voltage level V_PEAK and the high voltage level V_HIGH and the distance between the peak voltage level V_PEAK and the low voltage level V_LOW synchronously.

TABLE 4

|  | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| CR_HIGH | n | n | y | y | n | y | y | y | n | n | y | y | n | y | y | y |
| CR_PEAK | y | n | y | y | n | y | y | y | n | y | y | y | n | y | y | y |
| CR_LOW | y | y | y | y | y | y | y | y | y | y | y | y | y | y | y | y |

As mentioned above, the peak voltage level V_PEAK may track the peak height of the peak signal P1. However, when a vibration of the modulation signal occurs, the tracking peak voltage level V_PEAK may also move up and down together with the coil signal C1, and therefore affect the determination of vibration. In order to prevent this problem, the processor 111 may configure the peak voltage level V_PEAK to remain at a specific value and stop tracking the peak signal P1 when detecting a vibration signal. For example, a general modulation signal may include four up and down vibrations in the waveform, and the processor 111 may configure the peak voltage level V_PEAK to a specific value and stop tracking the peak signal P1 when the first up and down vibration appears in the waveform. As a result, the processor 111 may accurately perform determination on the second and follow-up vibrations.

In detail, the processor 111 may configure the value of the peak voltage level V_PEAK to a stable value of the peak voltage level V_PEAK obtained in the previous determination cycle when detecting that the coil signal C1 vibrates. For example, during a first determination cycle, the processor 111 may obtain a maximum continuous trigger count and a maximum continuous non-trigger count, where the maximum continuous trigger count is a maximum number of continuous peak values of the peak signal P1 reaching the peak voltage level V_PEAK and the maximum continuous non-trigger count is a maximum number of continuous peak values of the peak signal P1 failing to reach the peak voltage level V_PEAK. When both of the maximum continuous trigger count and the maximum continuous non-trigger count are smaller than a threshold value, the processor 111 may store the value of the peak voltage level V_PEAK in a buffer. That is, the processor 111 may obtain the maximum continuous trigger count that the peak values trigger the comparison result CR_PEAK to generate a pulse and the maximum continuous non-trigger count that the peak values do not trigger the comparison result CR_PEAK during the first determination cycle. If the maximum continuous trigger count of the comparison result CR_PEAK is greater than the threshold value, the processor 111 may determine that the peaks of the coil signal C1 keep rising, such that multiple continuous peak values of the peak signal P1 reach the peak voltage level V_PEAK. Therefore, the peak voltage level V_PEAK needs to keep rising to track the coil signal C1. If the maximum continuous non-trigger count of the comparison result CR_PEAK is greater than the threshold value, the processor 111 may determine that the peaks of the coil signal C1 keep falling, such that multiple continuous peak values of the peak signal P1 fail to reach the peak voltage level V_PEAK. Therefore, the peak voltage level V_PEAK needs to keep falling to track the coil signal C1. These two cases belong to the situation where the coil signal C1 is unstable; hence, the processor 111 may not store the value of the peak voltage level V_PEAK in the buffer.

On the other hand, if both of the maximum continuous trigger count and the maximum continuous non-trigger count of the comparison result CR_PEAK are smaller than the threshold value, there may be several peak values in coil driving cycles indicating a trigger and several peak values in coil driving cycles indicating no trigger. At this moment, the peaks of the coil signal C1 may remain at a stable value and the peak voltage level V_PEAK keeps tracking within a small voltage range. In such a situation, the processor 111 may determine that the coil signal C1 is stable and store the value of the peak voltage level V_PEAK in the buffer.

Assume that the value of the peak voltage level V_PEAK has been stored during the first determination cycle. If the processor 111 detects a peak value of the peak signal P1 reaching the high voltage level V_HIGH and another peak value of the peak signal P1 failing to reach the low voltage level V_LOW during a second determination cycle after the first determination cycle, the processor 111 may apply the value of the peak voltage level V_PEAK stored in the buffer to replace the peak voltage level V_PEAK obtained by tracking the peak signal P1 as a basis for configuring the high voltage level V_HIGH and the low voltage level V_LOW. In other words, when there exists a peak having a height reaching the high voltage level V_HIGH and also exists another peak having a height failing to reach the low voltage level V_LOW in the second determination cycle, there may be a vibration on the signal during the second determination cycle, where the vibration may be generated by the modulation signal. At this moment, the value of the peak voltage level V_PEAK stored in the buffer may be retrieved and used for configuring the high voltage level V_HIGH and the low voltage level V_LOW for the processor 111 to perform subsequent determination of modulation signal. The peak voltage level V_PEAK thereby remains at the value and stops tracking the peak signal P1. After a period of time, the peak voltage level V_PEAK then restarts to track the peak signal P1. The lasting time for the peak voltage level V_PEAK to remain at the value may be configured by the processor 111 or configured in the system in advance. In general, the processor 111 may know the modulation scheme of the power receiving terminal, and can thereby estimate or determine the length of the modulation signal in advance. Therefore, the processor 111 may configure the peak voltage level V_PEAK to remain constant until the modulation signal is completely received and then restart to track the peak signal P1.

In an embodiment, the above threshold value used for determining the maximum continuous trigger count (i.e., continuous peak values reaching the peak voltage level V_PEAK) and the maximum continuous non-trigger count (i.e., continuous peak values failing to reach the peak voltage level V_PEAK) is configured to 4; that is, the processor 111 may determine whether there are 4 continuous peak values of the peak signal P1 reaching the peak voltage level V_PEAK and/or 4 continuous peak values of the peak signal P1 failing to reach the peak voltage level V_PEAK. In a determination cycle, if 4 continuous peak values reaching the peak voltage level V_PEAK do not appear and 4 continuous peak values failing to reach the peak voltage level V_PEAK do not appear, the processor 111 may store the value of the peak voltage level V_PEAK in the buffer, for the utilization in the follow-up determination cycles. For example, if the comparison results $CR_{13}$ HIGH, CR_PEAK and CR_LOW in a determination cycle appear as shown in Table 1, the maximum continuous trigger count of the comparison result CR_PEAK is equal to 3 and the maximum continuous non-trigger count of the comparison result CR_PEAK is equal to 1. Therefore, the coil signal C1 is determined to be stable and the updated value of the peak voltage level V_PEAK in the determination cycle may be stored in the buffer. On the other hand, if the comparison results $CR_{13}$ HIGH, CR_PEAK and CR_LOW in a determination cycle appear as shown in Table 5, the maximum continuous trigger count of the comparison result CR_PEAK is equal to 7 and the maximum continuous non-trigger count of the comparison result CR_PEAK is equal to 5. Therefore, the coil signal C1 is determined to be unstable and the value of the peak voltage level V_PEAK may not be stored in the buffer.

TABLE 5

|  | 1 | 2 | 3 | 4 | 5 | 6 | 7 | 8 | 9 | 10 | 11 | 12 | 13 | 14 | 15 | 16 |
| --- | --- | --- | --- | --- | --- | --- | --- | --- | --- | --- | --- | --- | --- | --- | --- | --- |
| CR_HIGH | n | n | n | n | n | n | n | n | n | n | n | n | n | n | n | n |
| CR_PEAK | y | y | y | y | n | n | n | n | n | y | y | y | y | y | y | y |
| CR_LOW | y | y | y | y | y | y | y | y | y | y | y | y | y | y | y | y |

Furthermore, the processor 111 may perform the determination of stability of the coil signal C1 in each determination cycle. When determining that the coil signal C1 is stable, the processor 111 may update the value in the buffer. The processor 111 may also determine whether a signal vibration appears in the coil signal C1 in each determination cycle. Once a signal vibration is detected, the value of the peak voltage level V_PEAK in the buffer may be retrieved to replace the value obtained by tracking the peak signal P1.

Please note that the present invention uses an operational amplifier to amplify peak parts of the coil signal, and then uses a comparator module and a peak voltage level to track the peak signal. A high voltage level and a low voltage level are configured to determine a vibration signal. The accurate analysis of modulation signals can thereby be realized in the power supplying terminal of the induction type power supply system. In this manner, the peak voltage level, the high voltage level and the low voltage level may be adjusted dynamically according to the determination result in the previous cycle, in order to keep tracking the peak values of the coil signal. In addition, the reference voltage used for the operational amplifier may remain at a constant voltage, so that the operational amplifier may output a stable peak signal. More specifically, the processor may obtain the peak values during a period of time according to the sampling result of the sampling module, and configure the reference voltage accordingly, e.g., the processor may subtract a specific value from an average peak value during a period of time to generate the reference voltage. After the reference voltage is configured, the processor may control the value of the reference voltage to be constant. Only when a significant variation appears on the coil signal such that the operational amplifier cannot retrieve the peak parts of the coil signal, the processor adjusts the level of the reference voltage.

Different from the prior art where the coil signal is analyzed after undergoing a filtering, the present invention is capable of detecting each peak height on the coil signal and determining the modulation signal according to whether a vibration appears on the peak signal. When the distance between the supplying-end coil and the receiving-end coil is far, the vibration generated by the modulation signal on the coil may be weak, and therefore the envelope detector or filter of the prior art may filter out the weak vibration and cannot accurately detect the modulation signal. In contrast, according to the present invention, the processor is applied to configure the voltage levels and comparator modules are applied to determine signal vibrations, where the trigger behavior of signal vibrations based on the high voltage level and the low voltage level is evidently different from the trigger behavior of a noise. Therefore, even if the modulation signal received by the power supplying terminal is quite weak, the modulation signal can still be accurately determined via the signal analysis method of the present invention, and the noise and signal vibration can be clearly differentiated by the signal analysis method of the present invention. In general, the modulation signal may be transmitted during power supply, where the load of the power receiving terminal may easily generate a noise on the coil signal. The signal analysis method of the present invention is more difficult to be affected by the noise in contrast to the conventional filtering method.

In addition, the voltage levels used in the present invention may be digitalized, and signal demodulation is operated via the software in the processor. The physical hardware circuit is simplified to only few comparators, operational amplifiers and resistors, where a large circuit element such as an envelope detector and a filter is not required. This implementation can not only save the cost of circuit elements, but also achieve precise control via the digitalization of voltage levels. In addition, if the signal analysis circuit of the present invention is applied to a wireless charging product, most problems can be solved by updating the firmware, and several parameters may be configured by updating the firmware after product tests. In contrast, in a conventional signal analysis circuit using more circuit elements, when a problem occurs in the circuit elements, it is difficult to replace the circuit elements one by one. Therefore, the maintenance cost of signal analysis circuit of the present invention is far lower than the maintenance cost of the conventional signal analysis circuit. Further, the circuit elements in the market may always possess a certain mismatch. In contrast, according to the present invention, various voltage levels are digitalized and computed by the software, leading to high accuracy. Moreover, most of the circuit elements possess non-ideal characteristics, which limit the dynamic range of signal processing. In contrast, according to embodiments of the present invention, the computation of software is able to compensate the non-ideal characteristics of the circuit elements via the digitalization.

Please note that the signal analysis method and circuit of the present invention are capable of determining whether the peaks of the coil signal generate a trigger on voltage levels via the comparator modules with configurations of the voltage levels, in order to determine whether the power supplying terminal receives the modulation signal according to the trigger behavior. Those skilled in the art can make modifications and alternations accordingly. For example, in the above embodiments, the peak voltage level is used for tracking the peak signal, and the peak voltage level is adjusted upward and downward to generate a high voltage level and a low voltage level, respectively, to perform determination of vibration signals. In another embodiment, there may be multiple high voltage levels and/or multiple low voltage levels, where different high (or low) voltage levels may be apart from the peak voltage level with different distances, for detecting different magnitudes of vibration signals. A corresponding circuit structure may include more comparator modules to realize the comparison of more voltage levels.

Figure 3:
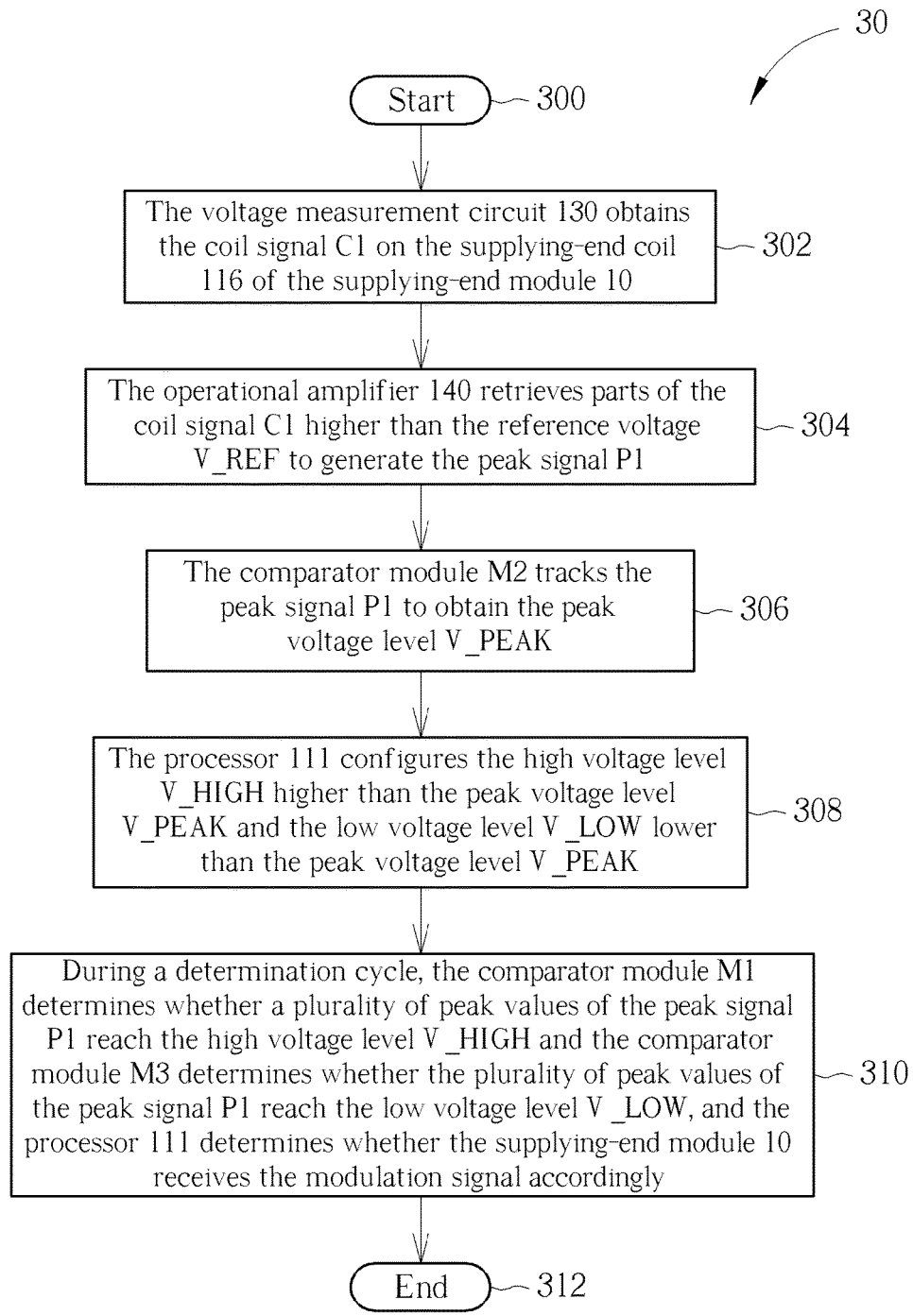
FIG. 3 is a schematic diagram of a signal analysis process according to an embodiment of the present invention.

The operations of the signal analysis circuit 100 in the supplying-end module 10 may be summarized into a signal analysis process 30, as shown in FIG. 3. The signal analysis process 30 includes the following steps:

Step 300: Start.

Step 302: The voltage measurement circuit 130 obtains the coil signal C1 on the supplying-end coil 116 of the supplying-end module 10.

Step 304: The operational amplifier 140 retrieves parts of the coil signal C1 higher than the reference voltage $V_{13}$ REF to generate the peak signal P1.

Step 306: The comparator module M2 tracks the peak signal P1 to obtain the peak voltage level V_PEAK.

Step 308: The processor 111 configures the high voltage level V_HIGH higher than the peak voltage level V_PEAK and the low voltage level V_LOW lower than the peak voltage level V_PEAK.

Step 310: During a determination cycle, the comparator module M1 determines whether a plurality of peak values of the peak signal P1 reach the high voltage level V_HIGH and the comparator module M3 determines whether the plurality of peak values of the peak signal P1 reach the low voltage level V_LOW, and the processor 111 determines whether the supplying-end module 10 receives the modulation signal accordingly.

Step 312: End.

Detailed operations and alternations of the signal analysis process 30 are illustrated in the above descriptions, and will not be narrated herein.

To sum up, the present invention provides a signal analysis method and circuit used in a supplying-end module of an induction type power supply system, for determining whether the supplying-end module receives a modulation signal from a power receiving terminal of the induction type power supply system. An operational amplifier retrieves peak parts of the coil signal and amplifies the peak parts. A comparator module then receives the amplified peak signal and tracks the peak height via a peak voltage level. Subsequently, the processor configures a high voltage level and a low voltage level according to the peak voltage level, and determines whether the supplying-end module receives the modulation signal according to whether the peak values of the peak signal reach the high voltage level and whether the peak values reach the low voltage level. In other words, signal vibrations may be detected by determining whether each peak value of the peak signal reaches the high voltage level and whether each peak value reaches the low voltage level. The determination of modulation signal may be performed accordingly. By the above method, the present invention may clearly differentiate a modulation signal and a noise according to the characteristics of signal vibrations. Even if the modulation signal is weak, the modulation signal may still be accurately detected. In addition, the circuit elements required in the present invention only include few operational amplifiers, comparators and resistors. The main voltage levels are digitalized and signal demodulation is operated via the software of the processor. As a result, the signal analysis method of the present invention is not easily affected by an error or mismatch of the circuit elements, and also has lower manufacture and maintenance costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal analysis method used in a supplying-end module of an induction type power supply system, for determining whether the supplying-end module receives a modulation signal from a receiving-end module of the induction type power supply system, the signal analysis method comprising:
   obtaining a coil signal on a supplying-end coil of the supplying-end module;
   retrieving parts of the coil signal higher than a reference voltage to generate a peak signal;
   tracking the peak signal to obtain a peak voltage level;

configuring a high voltage level higher than the peak voltage level with a preconfigured distance between the high voltage level and the peak voltage level and configuring a low voltage level lower than the peak voltage level with a preconfigured distance between the peak voltage level and the low voltage level; and determining whether a plurality of peak values of the peak signal reach the high voltage level and determining whether the plurality of peak values of the peak signal reach the low voltage level during a determination cycle, and determining whether the supplying-end module receives the modulation signal accordingly.

2. The signal analysis method of claim 1, wherein the step of determining whether the plurality of peak values of the peak signal reach the high voltage level and determining whether the plurality of peak values of the peak signal reach the low voltage level during the determination cycle, and determining whether the supplying-end module receives the modulation signal accordingly comprises:

determining a first number of times the plurality of peak values of the peak signal reach the high voltage level and a second number of times the plurality of peak values of the peak signal fail to reach the low voltage level during the determination cycle.

3. The signal analysis method of claim 2, wherein the step of determining whether the plurality of peak values of the peak signal reach the high voltage level and determining whether the plurality of peak values of the peak signal reach the low voltage level during the determination cycle, and determining whether the supplying-end module receives the modulation signal accordingly further comprises:

determining that the supplying-end module receives the modulation signal when a sum of the first number of times and the second number of times is greater than or equal to a first threshold value and a difference of the first number of times and the second number of times is smaller than or equal to a second threshold value.

4. The signal analysis method of claim 1, wherein the step of tracking the peak signal to obtain the peak voltage level comprises:

determining whether a peak value of the peak signal reaches the peak voltage level in each coil driving cycle; and increasing a value of the peak voltage level when the peak value reaches the peak voltage level, or decreasing the value of the peak voltage level when the peak value fails to reach the peak voltage level.

5. The signal analysis method of claim 1, further comprising:

obtaining a maximum continuous trigger count and a maximum continuous non-trigger count during a first determination cycle, wherein the maximum continuous trigger count is a maximum number of continuous peak values of the peak signal reaching the peak voltage level and the maximum continuous non-trigger count is a maximum number of continuous peak values of the peak signal failing to reach the peak voltage level; and storing a value of the peak voltage level in a buffer when both of the maximum continuous trigger count and the maximum continuous non-trigger count are smaller than a threshold value.

6. The signal analysis method of claim 5, further comprising:

applying the value of the peak voltage level stored in the buffer to replace the peak voltage level obtained by tracking the peak signal as a basis for configuring the high voltage level and the low voltage level, when a peak value of the peak signal reaching the high voltage level and another peak value of the peak signal failing to reach the low voltage level are detected during a second determination cycle after the first determination cycle.

7. The signal analysis method of claim 1, wherein a distance between the peak voltage level and the high voltage level is equal to a distance between the peak voltage level and the low voltage level, and the signal analysis method further comprising:

adjusting the distance according to a stability of the coil signal.

8. The signal analysis method of claim 7, wherein the step of adjusting the distance according to the stability of the coil signal comprises:

decreasing the distance when the stability of the coil signal indicates that the coil signal is stable; and increasing the distance when the stability of the coil signal indicates that the coil signal is unstable.

9. The signal analysis method of claim 7, wherein the stability is indicated by a non-stability status counter, wherein a larger value of the non-stability status counter indicates that the coil signal is more unstable, and the signal analysis method further comprises:

increasing the value of the non-stability status counter when a difference of a first number of times the plurality of peak values of the peak signal reach the high voltage level and a second number of times the plurality of peak values of the peak signal fail to reach the low voltage level during the determination cycle is greater than a specific value; and decreasing the value of the non-stability status counter when both of the first number of times and the second number of times during the determination cycle are equal to zero.

10. The signal analysis method of claim 9, further comprising:

increasing the distance when the value of the non-stability status counter is greater than a first threshold value; and decreasing the distance when the value of the non-stability status counter is smaller than a second threshold value.

11. A signal analysis circuit used in a supplying-end module of an induction type power supply system, for determining whether the supplying-end module receives a modulation signal from a receiving-end module of the induction type power supply system, the signal analysis circuit comprising:

a voltage measurement circuit, for obtaining a coil signal on a supplying-end coil of the supplying-end module;

an operational amplifier, for retrieving parts of the coil signal higher than a reference voltage to generate a peak signal;

a first comparator module, coupled to the operational amplifier, for tracking the peak signal to obtain a peak voltage level;

a processor, coupled to the first comparator module, for receiving the peak voltage level and configuring a high voltage level higher than the peak voltage level and a low voltage level lower than the peak voltage level;

a second comparator module, coupled to the processor and the operational amplifier, for comparing the peak signal with the high voltage level to determine whether a plurality of peak values of the peak signal reach the high voltage level during a determination cycle, to obtain a first comparison result; and a third comparator module, coupled to the processor and the operational amplifier, for comparing the peak signal with the low voltage level to determine whether the plurality of peak values of the peak signal reach the low voltage level during the determination cycle, to obtain a second comparison result;

wherein the processor determines whether the supplying-end module receives the modulation signal according to the first comparison result of the second comparator module and the second comparison result of the third comparator module.

12. The signal analysis circuit of claim 11, wherein the processor determines a first number of times the plurality of peak values of the peak signal reach the high voltage level during the determination cycle according to the first comparison result of the second comparator module and determines a second number of times the plurality of peak values of the peak signal fail to reach the low voltage level during the determination cycle according to the second comparison result of the third comparator module, and the processor determines whether the supplying-end module receives the modulation signal according to the first number of times and the second number of times.

13. The signal analysis circuit of claim 12, wherein the processor determines that the supplying-end module receives the modulation signal when a sum of the first number of times and the second number of times is greater than or equal to a first threshold value and a difference of the first number of times and the second number of times is smaller than or equal to a second threshold value.

14. The signal analysis circuit of claim 11, wherein the second comparator module comprises:
a digital to analog converter (DAC), for converting a value of the high voltage level outputted by the processor into an analog voltage; and
a comparator, coupled to the DAC, for comparing the peak signal with the analog voltage.

15. The signal analysis circuit of claim 11, wherein the third comparator module comprises:
a DAC, for converting a value of the low voltage level outputted by the processor into an analog voltage; and
a comparator, coupled to the DAC, for comparing the peak signal with the analog voltage.

16. The signal analysis circuit of claim 11, wherein the first comparator module comprises:
a DAC, for converting a value of the peak voltage level outputted by the processor into an analog voltage; and
a comparator, coupled to the DAC, for comparing the peak signal with the analog voltage to output a third comparison result;
wherein the processor determines whether a peak value of the peak signal reaches the peak voltage level in each coil driving cycle according to the third comparison result, and increasing the value of the peak voltage level when the peak value reaches the peak voltage level or decreasing the value of the peak voltage level when the peak value fails to reach the peak voltage level, to track the peak signal.

17. The signal analysis circuit of claim 16, wherein the processor further performs the following steps:
obtaining a maximum continuous trigger count and a maximum continuous non-trigger count during a first determination cycle according to the third comparison result, wherein the maximum continuous trigger count is a maximum number of continuous peak values of the peak signal reaching the peak voltage level and the maximum continuous non-trigger count is a maximum number of continuous peak values of the peak signal failing to reach the peak voltage level; and
storing the value of the peak voltage level in a buffer when both of the maximum continuous trigger count and the maximum continuous non-trigger count are smaller than a threshold value.

18. The signal analysis circuit of claim 17, wherein the processor applies the value of the peak voltage level stored in the buffer to replace the peak voltage level obtained by tracking the peak signal as a basis for configuring the high voltage level and the low voltage level, when the second comparator module detects a peak value of the peak signal reaching the high voltage level and the third comparator module detects another peak value of the peak signal failing to reach the low voltage level during a second determination cycle after the first determination cycle.

19. The signal analysis circuit of claim 11, wherein a distance between the peak voltage level and the high voltage level is equal to a distance between the peak voltage level and the low voltage level, and the processor adjusts the distance according to a stability of the coil signal.

20. The signal analysis circuit of claim 19, wherein the processor decreases the distance when the stability of the coil signal indicates that the coil signal is stable, and increases the distance when the stability of the coil signal indicates that the coil signal is unstable.

21. The signal analysis circuit of claim 19, wherein the processor comprises a non-stability status counter for indicating the stability, wherein a larger value of the non-stability status counter indicates that the coil signal is more unstable, and the processor further performs the following steps:
increasing the value of the non-stability status counter when a difference of a first number of times the plurality of peak values of the peak signal reach the high voltage level and a second number of times the plurality of peak values of the peak signal fail to reach the low voltage level during the determination cycle is greater than a specific value; and
decreasing the value of the non-stability status counter when both of the first number of times and the second number of times during the determination cycle are equal to zero.

22. The signal analysis circuit of claim 21, wherein the processor increases the distance when the value of the non-stability status counter is greater than a first threshold value, and decreases the distance when the value of the non-stability status counter is smaller than a second threshold value.

* * * * *

UNITED STATES PATENT AND TRADEMARK OFFICE
CERTIFICATE OF CORRECTION

PATENT NO. : 10,312,748 B2  
APPLICATION NO. : 15/197796  
DATED : June 4, 2019  
INVENTOR(S) : Ming-Chiu Tsai et al.

Page 1 of 1

It is certified that error appears in the above-identified patent and that said Letters Patent is hereby corrected as shown below:

On the Title Page

Item (73), correct the name of the assignee from "Fu Da Tong Techology Co., Ltd." to --Fu Da Tong Technology Co., Ltd.--.

Signed and Sealed this  
Sixth Day of August, 2019

Andrei Iancu  
*Director of the United States Patent and Trademark Office*